United States Patent
Pushp et al.

(10) Patent No.: US 11,177,549 B2
(45) Date of Patent: Nov. 16, 2021

(54) METHOD OF GROWING TITANIUM NITRIDE ON SILICON SUBSTRATE FREE FROM SILICON NITRIDE INTERFACE BY USING A TITANIUM SEED LAYER

(71) Applicant: INTERNATIONAL BUSINESS MACHINES CORPORATION, Armonk, NY (US)

(72) Inventors: Aakash Pushp, Santa Clara, CA (US); Benjamin Madon, Cupertino, CA (US); M A Mueed, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 16/676,278

(22) Filed: Nov. 6, 2019

(65) Prior Publication Data

US 2021/0135330 A1    May 6, 2021

(51) Int. Cl.
*H01L 21/00* (2006.01)
*H01P 7/00* (2006.01)
*C23C 16/34* (2006.01)
*C23C 16/50* (2006.01)
*H01P 11/00* (2006.01)

(52) U.S. Cl.
CPC ............ *H01P 7/00* (2013.01); *C23C 16/34* (2013.01); *C23C 16/50* (2013.01); *H01P 11/008* (2013.01)

(58) Field of Classification Search
CPC ....... H01L 39/00; H01L 39/005; H01L 39/12; H01L 39/14; H01L 39/223; H01L 39/2416; H01L 39/249; C23C 16/34; C23C 16/50; H01P 1/201; H01P 1/2013; H01P 7/00; H01P 11/008

USPC ............................................................ 438/2
See application file for complete search history.

(56) References Cited

U.S. PATENT DOCUMENTS

| 8,008,097 B2 | 8/2011 | Parkin |
| 8,954,125 B2 | 2/2015 | Corcoles Gonzalez et al. |
| 2013/0029848 A1* | 1/2013 | Gonzalez .............. H01P 1/2013 505/210 |

(Continued)

FOREIGN PATENT DOCUMENTS

| JP | 2016213363 | 12/2016 |
| WO | 2017015432 A1 | 1/2017 |

(Continued)

OTHER PUBLICATIONS

Krockenberger et al., Coherent growth of superconducting TiN thin films by plasma enhanced molecular beam epitaxy, Journal of Applied Physics 112, 083920 (2012). (Year: 2012).*

(Continued)

*Primary Examiner* — Brook Kebede
(74) *Attorney, Agent, or Firm* — Schmeiser, Olsen & Watts, LLP; Randall Bluestone

(57) ABSTRACT

A titanium (Ti) seed layer is formed from a Ti source directly on a surface of a substrate, where the surface is substantially free of oxide and nitride, and a reactive nitrogen species is introduced from a nitrogen plasma source and additional Ti is introduced from the Ti source, wherein the nitrogen plasma: (a) reacts with the Ti seed layer to form TiN and (b) reacts with the additional Ti to form additional TiN. The TiN and additional TiN collectively form a TiN superconducting layer that directly contacts the surface of the substrate.

26 Claims, 6 Drawing Sheets

(56) References Cited

U.S. PATENT DOCUMENTS

2015/0372217 A1    12/2015    Schoelkopf, III et al.

FOREIGN PATENT DOCUMENTS

WO        2018004578          1/2018
WO        2018065833 A1       4/2018

OTHER PUBLICATIONS

International Search Report; International application No. PCT/EP2020/081150; International filing date: May 11, 2020, 13 pages.
Vissers et al., low loss superconducting titanium nitride coplanar waveguide resonators, Applied Physics Letters vol. 97, No. 23, Dec. 9, 2010, 232509, 4 pages.
Krockenberger et al., Coherent growth of superconducting TiN thin films by plasma enhanced molecular beam epitaxy, Journal of Applied Physics, vol. 112, No. 8, 083920, Oct. 15, 2012, 6 pages.
Ohya S et al., Room temperature deposition of sputtered TiN films for superconducting coplanar waveguide resonators, Superconductor Science and Technology, vol. 27, No. 1, 015009, Dec. 5, 2013, 10 pages.

* cited by examiner

METHOD OF GROWING TITANIUM NITRIDE ON SILICON SUBSTRATE FREE FROM SILICON NITRIDE INTERFACE BY USING A TITANIUM SEED LAYER

BACKGROUND OF THE INVENTION

Field of Invention

The present invention relates generally to growing titanium nitride (TiN) on silicon substrates. More specifically, the present invention is related to growing a titanium (Ti) seed layer prior to growing TiN on silicon substrates free from silicon nitride interface.

Discussion of Related Art

FIGS. 1A-C depict a prior art method for growing nitrides on silicon substrates. FIG. 1A depicts a Si<100>/SiO$_x$ wafer or Si<111>/SiO$_x$ wafer.

FIG. 1B depicts the Si<100> or Si<111> substrate with the SiO$_x$ being removed via wet etching (e.g., buffered oxide etch).

FIG. 1C depicts a nitride layer (e.g., TiN layer, VN layer, MoN$_x$ layer, etc.) formed by sputtering metal (e.g., Ti, V, Mo, etc.) in the presence of Argon-Nitrogen (Ar—N$_2$) plasma. FIG. 1C also depicts the problem with such prior art nitride growth techniques. The high temperature (~500° C. or above) and/or the plasma containing reactive nitrogen-based plasma species typically used in this process causes the Silicon substrate top-surface to react and form SiN$_x$ at the interface of the nitride layer (e.g., TiN layer, VN layer, MoN$_x$ layer, etc.) and the Si<100> or Si<111> substrate.

FIGS. 1D-1E depict one example of the formation of SiN$_x$ layer in between the TiN layer and Si substrate layer.

Formation of such intermediary silicon nitride layers is not desirable.

Embodiments of the present invention are an improvement over prior art systems and methods.

SUMMARY OF THE INVENTION

In one embodiment, the present invention provides a method comprising: forming a titanium (Ti) seed layer from a Ti source directly on a surface of a reactive substrate, the surface being substantially free of oxide and nitride; and introducing a reactive nitrogen species from a nitrogen plasma source and additional Ti from the Ti source, the nitrogen plasma: (a) reacting with the Ti seed layer to form TiN, and (b) reacting with the additional Ti to form additional TiN, the TiN and additional TiN collectively forming a TiN superconducting layer that directly contacts the surface of the substrate.

In another embodiment, the present invention provides a device, comprising: a substrate; and a TiN superconducting layer overlying and in contact with the substrate, wherein the substrate is substantially free of both Ti and nitrogen, and wherein the TiN superconducting layer is formed by: forming a titanium (Ti) seed layer from a Ti source directly on a surface of a substrate, the surface being substantially free of oxide and nitride; and introducing a reactive nitrogen species from a nitrogen plasma source and additional Ti from the Ti source, the nitrogen plasma: (a) reacting with the Ti seed layer to form TiN, and (b) reacting with the additional Ti to form additional TiN, the TiN and additional TiN collectively forming a TiN superconducting layer that directly contacts the surface of the substrate.

In yet another embodiment, the present invention provides a method, comprising: depositing titanium (Ti) onto a surface of an underlayer to form a Ti layer thereon, wherein the surface of the underlayer is selected to be substantially free of oxide and nitride; and directing additional Ti, in the presence of a reactive nitrogen species, towards the Ti layer to form a TiN superconducting layer in contact with the surface of the underlayer, the nitrogen reacting with both the additional Ti and the Ti layer, thereby forming the TiN superconducting layer in contact with the surface of the underlayer.

In another embodiment, the present invention provides a method comprising: forming a titanium (Ti) seed layer from a Ti source directly on a surface of a substrate, the surface being substantially free of oxide and nitride; introducing a reactive nitrogen species from a nitrogen plasma source and additional Ti from the Ti source, the nitrogen plasma: (a) reacting with the Ti seed layer to form TiN, and (b) reacting with the additional Ti to form additional TiN, the TiN and additional TiN collectively forming a TiN superconducting layer of a first thickness that directly contacts the surface of the substrate; and increasing the temperature of the substrate to above 100° C., while increasing the thickness of the TiN layer to a second thickness.

In yet another embodiment, the present invention provides a method comprising: forming a seed layer from a metal source directly on a surface of a substrate, the source picked from any of the following: Titanium (Ti), Vanadium (V), Zirconium (Zr), Tungsten (W), Tantalum (Ta) and Molybdenum (Mo), the surface being substantially free of oxide and nitride; and introducing reactive nitrogen species from a nitrogen plasma source and additional metal from the metal source picked from Titanium (Ti), Vanadium (V), Zirconium (Zr), Tungsten (W), Tantalum (Ta) and Molybdenum (Mo), the nitrogen plasma: (a) reacting with the seed layer to form a nitride and (b) reacting with the additional metal to form an additional nitride, the nitride and the additional nitride collectively forming a nitride superconducting layer that directly contacts the surface of the substrate.

In another embodiment, the present invention provides a comprising: a substrate; and a TiN superconducting layer overlying and in contact with the substrate, wherein the substrate is substantially free of both Ti and nitrogen, and wherein the TiN superconducting layer is formed by: forming a titanium (Ti) seed layer from a Ti source directly on a surface of a substrate, the surface being substantially free of oxide and nitride; and introducing a reactive nitrogen species from a nitrogen plasma source and additional Ti from the Ti source, the nitrogen plasma: (a) reacting with the Ti seed layer to form TiN, and (b) reacting with the additional Ti to form additional TiN, the TiN and additional TiN collectively forming a TiN superconducting layer that directly contacts the surface of the substrate, and wherein the TiN superconducting layer has been etched to form a superconducting resonator, and wherein the quality factor of the superconducting resonator is between 100,000 and 1 billion.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

FIG. 1B depicts a silicon substrate with the $SiO_x$ being removed via wet etching.

FIG. 1C depicts a nitride layer formed by sputtering metal in the presence of nitrogen plasma.

DESCRIPTION OF THE PREFERRED EMBODIMENTS

Figure 1C:
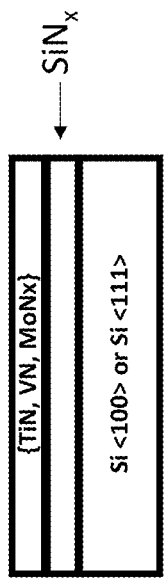
FIGS. 1A-C depict a prior art method for growing nitrides on silicon substrates.
Figure 1A:
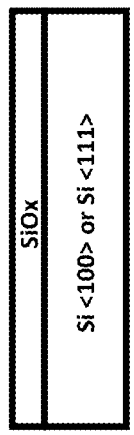
Figure 1B:
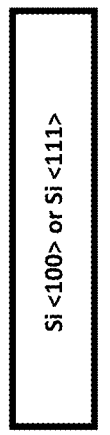
Figures 1D, 1E:
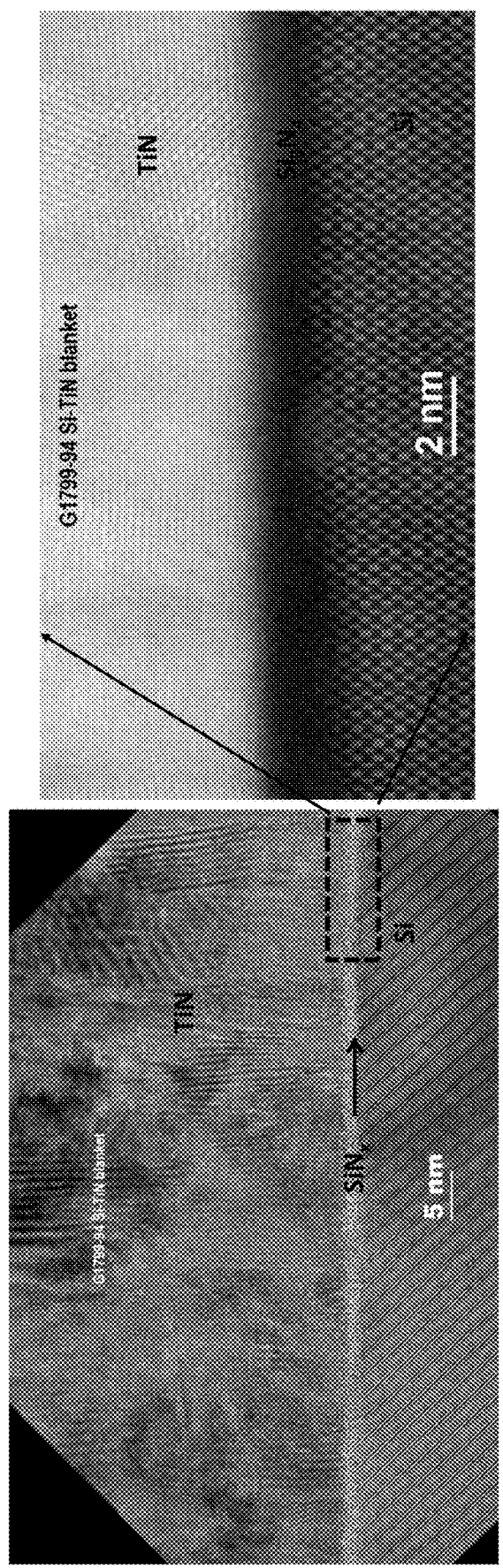
FIGS. 1D-1E depict one example of the undesirable formation of a $SiN_x$ layer in between the TiN layer and Si substrate layer.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

Figure 2B:
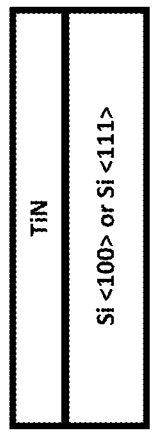
FIGS. 2A-B depict one embodiment of the present invention's method where a titanium (Ti) seed layer is formed directly on a surface of a substrate.
Figure 2A:
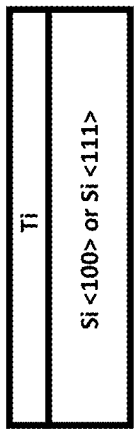

FIG. 2A depicts one embodiment of the present invention's method. First, a titanium (Ti) seed layer is formed from a Ti source directly on a surface of a substrate (e.g., Si<100> or Si<111> substrate), where the surface of the substrate is free of oxide and nitride. The thickness of the Ti seed on the surface of the substrate ranges from 0.5 nm to 1 nm. Next, a reactive nitrogen species is introduced from a nitrogen plasma source and additional Ti is introduced from the Ti source. The nitrogen plasma (a) reacts with the Ti seed layer to form titanium nitride (TiN) and (b) reacts with the additional Ti to form additional TiN, the TiN and additional TiN collectively forming a TiN superconducting layer that directly contacts the surface of the substrate as shown in FIG. 2B. The TiN layer formed has a final thickness ranging between 1 nm and 2000 nm.

It should be noted that while formation of TiN from Ti seed layer is described, other seed layers and corresponding nitride layers are envisioned. For example, Vanadium (V), Zirconium (Zr), Tungsten (W), Tantalum (Ta) and Molybdenum (Mo) having a thickness in the range from 0.5 nm to 1 nm may be used for the seed layer, and their corresponding nitrides (e.g., VN, ZrN, $WN_x$, $TaN_x$, $MoN_x$) may be formed above the silicon substrate. The thickness of the nitride layer may be in the range from 1 nm to 2000 nm.

Figure 2D:
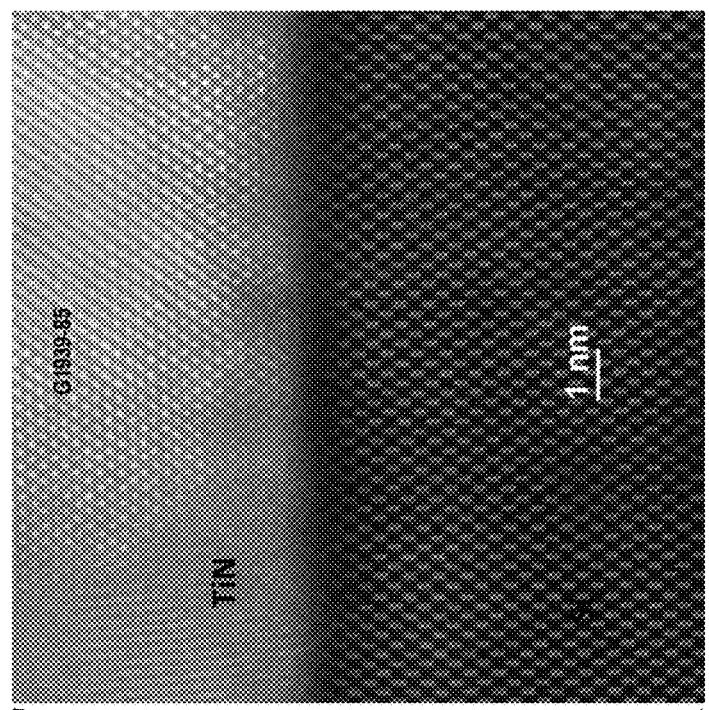
FIGS. 2C-D depict one example of the formation of a TiN layer and a Si substrate layer without any intermediate silicon nitride layers.
Figure 2C:
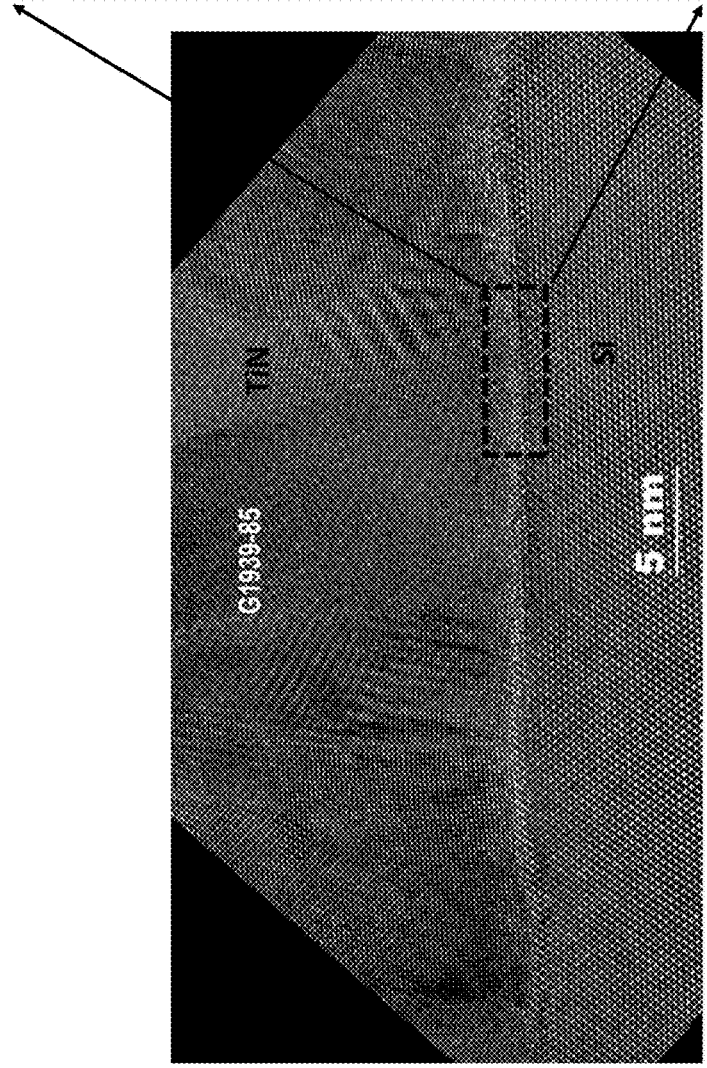

FIGS. 2C-D depict one example of the formation of a TiN layer and a Si substrate layer without any intermediate silicon nitride layers. It is observed that no $SiN_x$ is formed if TiN is grown from a Ti seed on Si.

In another embodiment, the present invention provides a device, comprising: a substrate; and a TiN superconducting layer overlying and in contact with the substrate, wherein the substrate is substantially free of both Ti and nitrogen, and wherein the TiN superconducting layer is formed by: forming a titanium (Ti) seed layer from a Ti source directly on a surface of a substrate, the surface being substantially free of oxide and nitride; and introducing reactive nitrogen species from a nitrogen plasma source and additional Ti from the Ti source, the nitrogen plasma (a) reacting with the Ti seed layer to form TiN and (b) reacting with the additional Ti to form additional TiN, the TiN and additional TiN collectively forming a TiN superconducting layer that directly contacts the surface of the substrate.

Figure 3A:
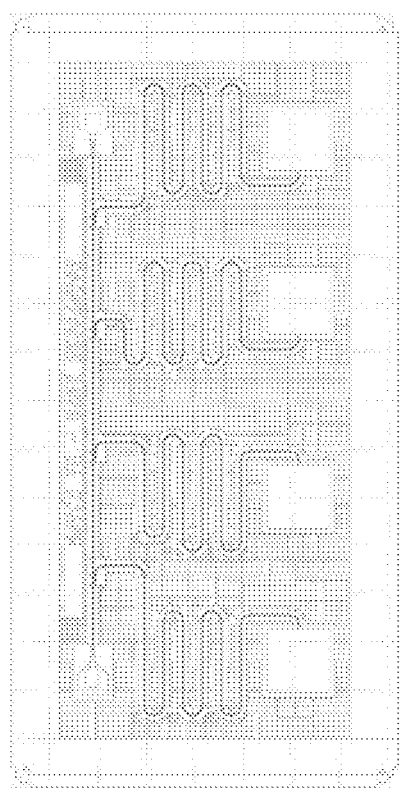
FIG. 3A depicts a computer-aided design (CAD) of such a bare resonator according the teachings of the present invention.
Figure 3B:
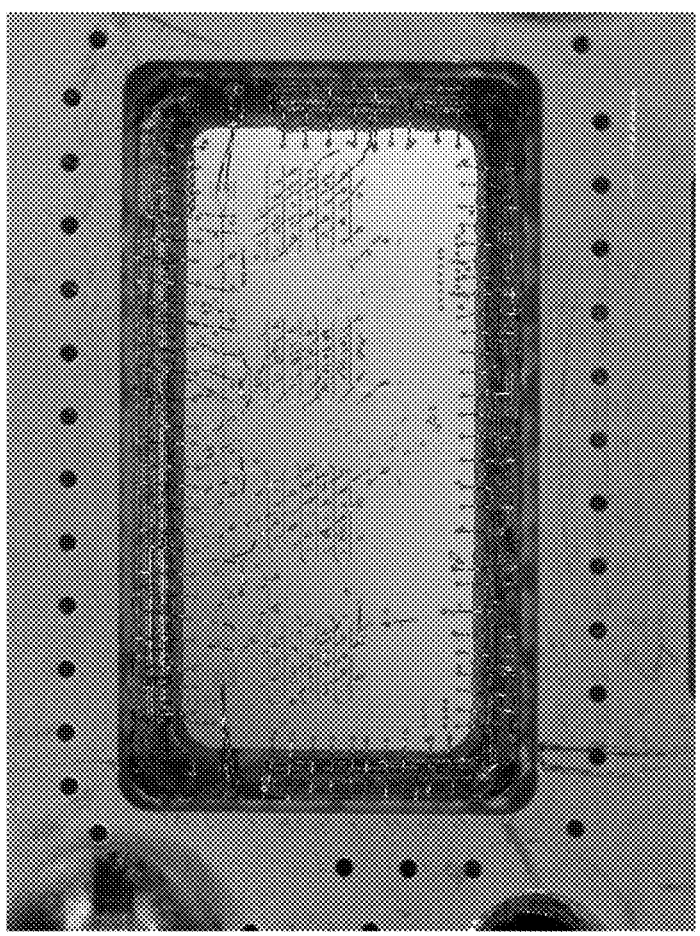
FIG. 3B depicts an optical image of a bare resonator formed from superconducting titanium nitride (TiN) that was grown on top of a substrate as per the teachings of the present invention.

The quality factor (Q) of a superconducting resonator formed from such a TiN film free from $SiN_x$ interface is between 100,000 and 1 billion. FIG. 3A depicts a computer-aided design (CAD) of such a bare resonator according to the teachings of the present invention. FIG. 3B depicts an optical image of a bare resonator formed from superconducting titanium nitride (TiN) that was grown on top of a Silicon substrate as per the teachings of the present invention.

Figure 4:
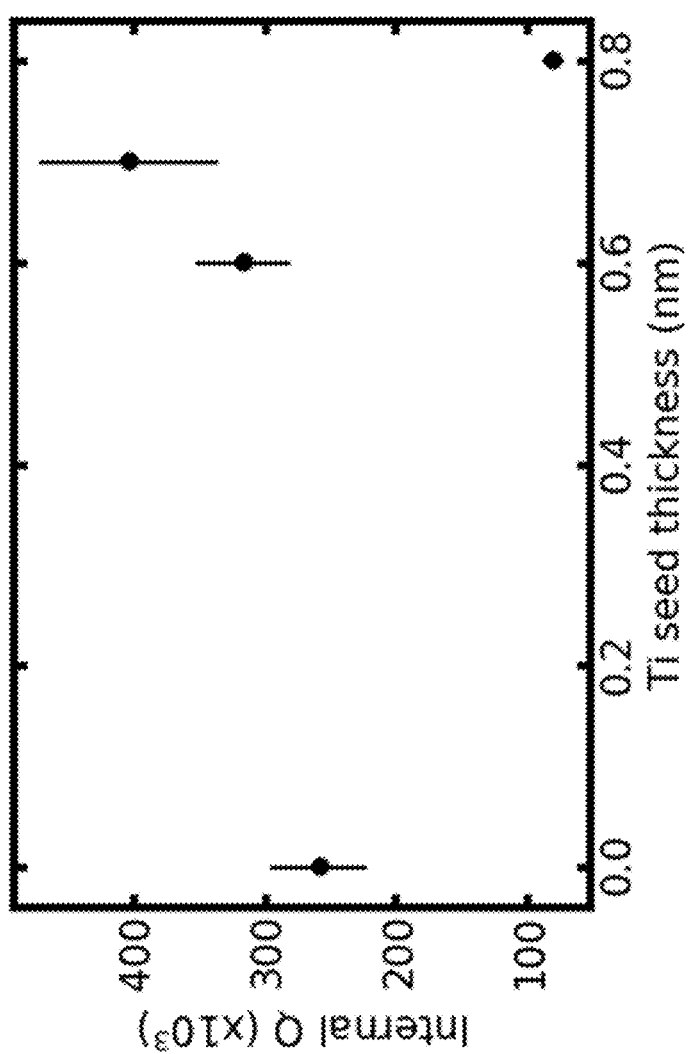
FIG. 4 depicts a graph of Q (in units of $10^3$) versus Ti seed thickness (in nm).

FIG. 4 depicts a graph of quality factor, Q, (in units of $10^3$) versus Ti seed thickness (in nm). From the graph, it can be seen that Q improves gradually from 0.6 nm to 0.7 nm, and then drops off sharply when the thickness of the Ti seed layer is 0.8 nm.

In yet another embodiment, the present invention provides a method, comprising: depositing titanium (Ti) onto a surface of an underlayer to form a Ti layer thereon, wherein the surface of the underlayer is selected to be substantially free of oxide and nitride; and directing additional Ti, in the presence of nitrogen plasma, towards the Ti layer to form a TiN superconducting layer in contact with the surface of the underlayer, the nitrogen plasma reacting with both the additional Ti and the Ti layer, thereby forming the TiN superconducting layer in contact with the surface of the underlayer.

In another embodiment, the present invention provides a method comprising: forming a titanium (Ti) seed layer from a Ti source directly on a surface of a substrate, the surface being substantially free of oxide and nitride; introducing a reactive nitrogen species from a nitrogen plasma source and additional Ti from the Ti source, the nitrogen plasma: (a) reacting with the Ti seed layer to form TiN and (b) reacting with the additional Ti to form additional TiN, the TiN and additional TiN collectively forming a TiN superconducting layer of a first thickness that directly contacts the surface of the substrate; and increasing the temperature of the substrate to above 100° C., while increasing the thickness of the TiN layer to a second thickness.

It is understood that any specific order or hierarchy of steps in the processes disclosed is an illustration of example approaches. Based upon design preferences, it is understood that the specific order or hierarchy of steps in the processes may be rearranged, or that all illustrated steps be performed. Some of the steps may be performed simultaneously.

Various modifications to these aspects will be readily apparent, and the generic principles defined herein may be applied to other aspects. Thus, the claims are not intended to be limited to the aspects shown herein, but is to be accorded the full scope consistent with the language claims, where reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase, for example, an "aspect" does not imply that the aspect is essential to the subject technology or that the aspect applies to all configurations of the subject technology. A disclosure relating to an aspect may apply to all configurations, or one or more configurations. A phrase, for example, an aspect may refer to one or more aspects and vice versa. A phrase, for example, a "configuration" does not imply that such configuration is essential to the subject technology or that such configuration applies to all configurations of the subject technology. A disclosure relating to a configuration may apply to all configurations, or one or more configurations. A configuration may refer to one or more configurations and vice versa.

The various embodiments described above are provided by way of illustration only and should not be construed to limit the scope of the disclosure. Those skilled in the art will readily recognize various modifications and changes that may be made to the principles described herein without following the example embodiments and applications illustrated and described herein, and without departing from the spirit and scope of the disclosure.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

CONCLUSION

A system and method have been shown in the above embodiments for growing a Ti seed layer before TiN growth on Si substrates. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A method comprising:
   forming a titanium (Ti) seed layer from a Ti source directly on a surface of a substrate, the surface being substantially free of oxide and nitride; and
   introducing a reactive nitrogen species from a nitrogen plasma source and additional Ti from the Ti source, the nitrogen plasma: (a) reacting with the Ti seed layer to form TiN and (b) reacting with the additional Ti to form additional TiN, the TiN and additional TiN collectively forming a TiN superconducting layer that directly contacts the surface of the substrate.

2. The method of claim 1, wherein the substrate is substantially free of both nitrogen and titanium.

3. The method of claim 1, wherein the Ti seed layer has a thickness between 0.5 nm and 1 nm.

4. The method of claim 1, wherein the Ti seed layer has a first thickness between 0.5 nm and 1 nm, and the method further comprises:
   increasing the temperature of the substrate to above 100° C., and increasing thickness of the TiN layer from the first thickness to a second thickness.

5. The method of claim 4, wherein the second thickness is in the following range: 1 nm-2000 nm.

6. A device, comprising:
   a substrate; and
   a TiN superconducting layer overlying and in contact with the substrate, wherein the substrate is substantially free of both Ti and nitrogen, and wherein the TiN superconducting layer is formed by:
   forming a titanium (Ti) seed layer from a Ti source directly on a surface of a substrate, the surface being substantially free of oxide and nitride; and
   introducing a reactive nitrogen species from a nitrogen plasma source and additional Ti from the Ti source, the nitrogen plasma: (a) reacting with the Ti seed layer to form TiN and (b) reacting with the additional Ti to form additional TiN, the TiN and additional TiN collectively forming a TiN superconducting layer that directly contacts the surface of the substrate.

7. The device of claim 6, wherein the device is part of a superconducting resonator formed from the TiN superconducting layer, wherein the quality factor of the superconducting resonator is between 100,000 and 1 billion.

8. A method, comprising:
   depositing titanium (Ti) onto a surface of an underlayer to form a Ti layer thereon, wherein the surface is selected to be substantially free of oxide and nitride; and
   directing additional Ti, in the presence of a reactive nitrogen species, towards the Ti layer to form a TiN superconducting layer in contact with the surface of the underlayer, the nitrogen reacting with both the additional Ti and the Ti layer, thereby forming the TiN superconducting layer in contact with the surface of the underlayer.

9. The method of claim 8, wherein the surface of the underlayer is substantially free of both nitrogen and titanium.

10. The method of claim 8, wherein the Ti layer has a thickness between 0.5 nm and 1 nm.

11. The method of claim 8, wherein said directing additional Ti, in the presence of nitrogen, comprises:
   forming the TiN layer having a first thickness between 0.5 nm and 2 nm; and
   increasing the temperature of the underlayer to above 100° C., and increasing the thickness of the TiN superconducting layer from the first thickness to a second thickness.

12. The method of claim 11, wherein the second thickness is in the following range: 2 nm-2000 nm.

13. A method comprising:
forming a titanium (Ti) seed layer from a Ti source directly on a surface of a substrate, the surface being substantially free of oxide and nitride;
introducing a reactive nitrogen species from a nitrogen plasma source and additional Ti from the Ti source, the nitrogen plasma: (a) reacting with the Ti seed layer to form TiN and (b) reacting with the additional Ti to form additional TiN, the TiN and additional TiN collectively forming a TiN superconducting layer of a first thickness that directly contacts the surface of the substrate; and
increasing the temperature of the substrate to above 100° C., while increasing the thickness of the TiN layer to a second thickness.

14. The method of claim 13, wherein the substrate is substantially free of both nitrogen and titanium.

15. The method of claim 13, wherein the Ti seed layer has a thickness between 0.5 nm and 1 nm.

16. The method of claim 13, wherein the first thickness is between 1 nm and 2 nm.

17. The method of claim 13, wherein the second thickness is between 2 nm and 2000 nm.

18. A method comprising:
forming a seed layer from a metal source directly on a surface of a substrate, the source picked from any of the following: Titanium (Ti), Vanadium (V), Zirconium (Zr), Tungsten (W), Tantalum (Ta) and Molybdenum (Mo), the surface being substantially free of oxide and nitride; and
introducing a reactive nitrogen species from a nitrogen plasma source and additional metal from the metal source, the nitrogen plasma: (a) reacting with the seed layer to form a nitride and (b) reacting with the additional metal picked from Titanium (Ti), Vanadium (V), Zirconium (Zr), Tungsten (W), Tantalum (Ta) and Molybdenum (Mo) to form an additional nitride, the nitride and the additional nitride collectively forming a nitride superconducting layer that directly contacts the surface of the substrate.

19. The method of claim 18, wherein the substrate is substantially free of both nitrogen and the source.

20. The method of claim 18, wherein the seed layer has a thickness between 0.5 nm and 1 nm.

21. The method of claim 18, wherein the seed layer has a first thickness between 0.5 nm and 1 nm, and the method further comprises:
increasing the temperature of the substrate to above 100° C., while increasing the thickness of the nitride layer from the first thickness to a second thickness.

22. The method of claim 21, wherein the thickness of the nitride layer is increased to be in the following range: 2 nm-2000 nm.

23. A device, comprising:
a substrate; and
a TiN superconducting layer overlying and in contact with the substrate, wherein the substrate is substantially free of both Ti and nitrogen, and wherein the TiN superconducting layer is formed by:
forming a titanium (Ti) seed layer from a Ti source directly on a surface of a substrate, the surface being substantially free of oxide and nitride; and
introducing a reactive nitrogen species from a nitrogen plasma source and additional Ti from the Ti source, the nitrogen plasma: (a) reacting with the Ti seed layer to form TiN and (b) reacting with the additional Ti to form additional TiN, the TiN and additional TiN collectively forming a TiN superconducting layer that directly contacts the surface of the substrate, and
wherein the TiN superconducting layer has been etched to form a superconducting resonator, and
wherein the quality factor of the superconducting resonator is between 100,000 and 1 billion.

24. The device of claim 23, wherein the thickness of the Ti seed layer is 5 Angstroms-7 Angstroms.

25. The device of claim 23, wherein the thickness of the Ti seed layer is less than 8 Angstroms.

26. The device of claim 23, wherein the thickness of the Ti seed layer is less than 1 nm.

* * * * *